(12) United States Patent
Guo et al.

(10) Patent No.: US 11,049,529 B2
(45) Date of Patent: *Jun. 29, 2021

(54) NARROW RANGE SENSE AMPLIFIER WITH IMMUNITY TO NOISE AND VARIATION

(71) Applicant: Applied Materials, Inc., Santa Clara, CA (US)

(72) Inventors: Frank Tzen-Wen Guo, Danville, CA (US); Bhuvaneshwari Ayyagari-Sangamalli, Cupertino, CA (US); Angada B. Sachid, San Jose, CA (US); Blessy Alexander, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/009,710

(22) Filed: Sep. 1, 2020

(65) Prior Publication Data

US 2020/0402549 A1 Dec. 24, 2020

Related U.S. Application Data

(63) Continuation of application No. 16/438,090, filed on Jun. 11, 2019, now Pat. No. 10,803,913.

(51) Int. Cl.
*G11C 7/08* (2006.01)
*G11C 7/06* (2006.01)
*G11C 11/16* (2006.01)

(52) U.S. Cl.
CPC ............... *G11C 7/08* (2013.01); *G11C 7/065* (2013.01); *G11C 11/1655* (2013.01); *G11C 11/1673* (2013.01)

(58) Field of Classification Search
CPC ....... G11C 7/08; G11C 7/065; G11C 11/1655; G11C 11/1673
See application file for complete search history.

(56) References Cited

U.S. PATENT DOCUMENTS 7,239,537 B2 7/2007 DeBrosse et al.
8,693,273 B2 4/2014 Yuh et al.
(Continued)

FOREIGN PATENT DOCUMENTS

KR 10-1582731 B1 1/2016

OTHER PUBLICATIONS

International Search Report and Written Opinion dated Aug. 13, 2020 in International Patent Application No. PCT/US2020/030937, 9 pages.

*Primary Examiner* — Tri M Hoang
(74) *Attorney, Agent, or Firm* — Kilpatrick Townsend & Stockton LLP

(57) ABSTRACT

A memory circuit may include a memory array, and the memory array may include a plurality of data columns. The plurality of data columns may be configured to store data bits and provide data signals when selected by a read operation. The memory array may also include one or more reference columns distributed in the memory array and configured to provide a reference signal. The reference signal may track with process, voltage, and temperature variations that are specific to the memory array, and may be used to remove a common signal component and adjust the signal level to distinguish between logic 0 and logic 1 data signals.

19 Claims, 8 Drawing Sheets

(56) References Cited

U.S. PATENT DOCUMENTS

| | | |
|---|---|---|
| 9,251,881 B2 | 2/2016 | Kim et al. |
| 9,349,428 B2 | 5/2016 | Antonyan et al. |
| 9,747,965 B2 | 8/2017 | Jan et al. |
| 2013/0148429 A1 | 6/2013 | Kim et al. |
| 2013/0293286 A1* | 11/2013 | Li .................... G11C 11/1673 327/538 |
| 2015/0262622 A1* | 9/2015 | Iizuka ................ G11C 13/004 365/63 |
| 2016/0035402 A1 | 2/2016 | Antonyan |
| 2016/0172026 A1 | 6/2016 | Lee |
| 2017/0301384 A1 | 10/2017 | Andre et al. |
| 2018/0350419 A1* | 12/2018 | Koike ................ G11C 11/1673 |
| 2019/0295621 A1* | 9/2019 | Ikegami ................ H01L 43/02 |

* cited by examiner

NARROW RANGE SENSE AMPLIFIER WITH IMMUNITY TO NOISE AND VARIATION

CROSS-REFERENCE TO RELATED APPLICATIONS

This application is a continuation of U.S. application Ser. No. 16/438,090, filed Jun. 11, 2019, now U.S. Pat. No. 10,803,913, issued on Oct. 13, 2020, which is incorporated here by reference.

BACKGROUND

Modern computer memories use sense amplifiers as part of the circuitry used to read data from the memory. The role of the sense amplifier is to sense low-power signals from a bit line that represents a single bit of data (1 or 0) stored in a memory cell. The sense amplifier then amplifies the small voltage swings to logic levels that can be recognized and interpreted properly by digital logic that interfaces with the memory. Generally, a sense amplifier is included for the columns of memory cells through a column multiplexor in a memory array. High-performance memories require sense amplifiers that minimize sense delay with low power consumption while maximizing the level of voltage-difference amplification.

SUMMARY

In some embodiments, a memory circuit may include a memory array with one or more reference columns providing a reference signal and a plurality of data columns. The plurality of data columns may include a data column providing a data signal when selected by a read operation. The memory circuit may also include a first circuit that removes a common signal component from the reference signal and from the data signal; a second circuit that adjusts the reference signal to be between a logic 1 signal level and a logic 0 signal level; and a sense amplifier that determines whether the data signal represents a logic 1 or a logic 0. A sense amplifier may use the reference signal after the common signal component is removed by the first circuit and after being adjusted by the second circuit. The sense amplifier may also use the data signal after having the common signal component removed by the first circuit.

In some embodiments, a method of reading data from a memory circuit may include receiving a reference signal from one or more reference columns located in a memory array, and receiving a data signal from a data column in a plurality of data columns in the memory array. The data signal may be provided by the data column when selected by a read operation. The method may also include removing a common signal component from the reference signal and from the data signal. The method may additionally include adjusting the reference signal to be between a logic 1 signal level and a logic 0 signal level. The method may further include providing the reference signal to a sense amplifier after the common signal component is removed and after being adjusted to be between the logic 1 signal level and the logic 0 signal level. The method may also include providing the data signal the sense amplifier after removing after the common signal component is removed.

In any embodiments, any of the following features may be included or implemented in any combination and without limitation. The sense amplifier may be a latch amplifier. The memory array may include a magnetic RAM (MRAM) array. The one or more reference columns may include a reference column located in an approximate center of the memory array. The one or more reference columns may include a plurality of reference columns, and the reference signal may be generated by averaging currents from a subset of the plurality of reference columns. The one or more reference columns may include a first reference column that provides the reference signal, and a second reference column that acts as a backup for the first reference column. The plurality of data columns in the memory array may include pluralities of bit cells configured to output stored logic levels, and the one or more reference columns may include a plurality of bit cells that are configured to output the logic 0 signal level. The reference signal may be adjusted by reducing the reference signal to an approximate center signal level between the logic 1 signal level and the logic 0 signal level. The reference signal may be reduced by injecting a signal into the reference signal, where an amount of the signal injected into the reference signal may be controlled by a cascoding transistor pair. The common signal component may be removed from the reference signal and from the data signal by injecting a signal into the reference signal and the data signal, where an amount of the signal injected into the reference signal and the data signal may be controlled by cascoding transistor pairs.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Described herein are embodiments for a narrow-range sense amplifier with immunity to noise and process variations. Resistive memory cells have very small ratios between the on-resistance and the off-resistance measured by the sense amplifier. Furthermore, process variations can cause reference currents used by the sense amplifier to drift independently of data signals received from the memory array. In the embodiments described herein, "dummy" reference columns may be placed in the memory array to provide reference signals that track the process, voltage, and/or temperature variations that also occur in the data signals. Both the reference signal and the data signal can be preprocessed before being passed to the sense amplifier to remove a common signal component from the reference signal and the data signal and to increase the ratio between the on-state and off-state resistance. The reference signal can also be centered between signal levels for the on state and the off state.

Traditional random-access memory (RAM) design such as flash memory, dynamic RAM (DRAM), static RAM (SRAM), etc., have dominated the computer memory market for the last 20 years. However, resistive memory technologies represent an emerging and viable alternative that may perform well in certain applications. Resistive random-access memory (ReRAM or RRAM) represents a type of nonvolatile computer memory that operates by changing a resistance across a material, such as a dielectric solid-state material. A particular type of resistive memory technology known as magnetoresistive random-access memory (MRAM) stores data in magnetic domains affecting the circuit resistance. It has long been thought that MRAM may eventually surpass competing technologies in computer memory. Like SRAM and DRAM, MRAM is symmetrical memory that can both read and write at high speeds. MRAM is also nonvolatile such that content is not lost when power is removed from the memory cell. However, flash RAM, SRAM, DRAM, and other non-magnetic memories still have practical advantages that have prevented MRAM from being widely used in computer memory. The embodiments described herein overcome some of the technical challenges that exist in current MRAM designs.

Figure 1A:
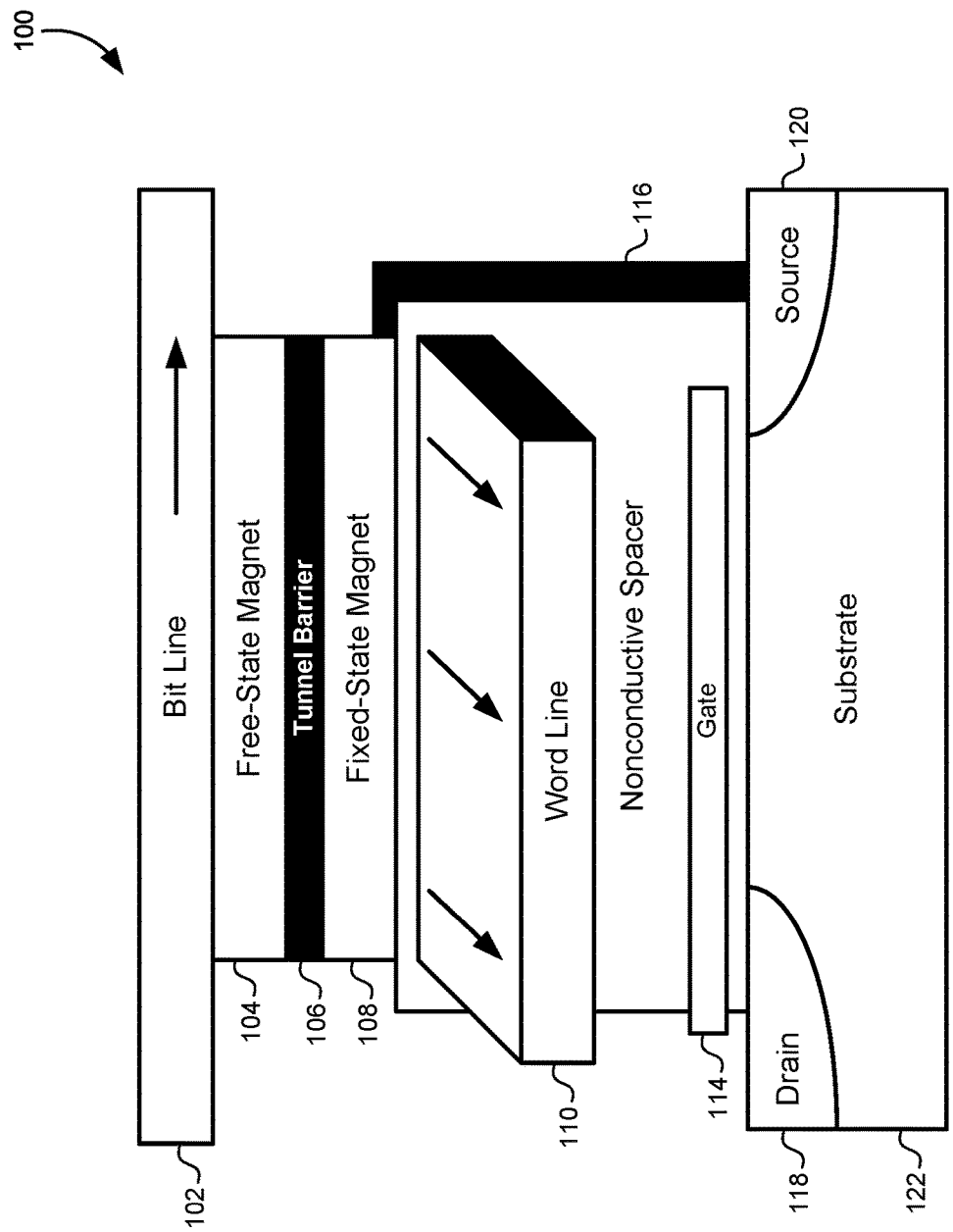
FIG. 1A illustrates a diagram of a classical MRAM cell, according to some embodiments.

FIG. 1A illustrates a diagram of a classical MRAM cell 100, according to some embodiments. MRAM technology utilizes the relative polarity of a pair of magnets to store a single bit of information. When two magnets are placed in series with their polarities aligned, the resistance of an electrical current running through those two magnets will be relatively low. For example, placing two magnets in series such that the south pole of one magnet is series-connected to the north pole of the other magnet may produce a first resistance that is relatively low. Conversely, placing two magnets in series such that the south pole of one magnet is series-connected to the south pole of the other magnet may produce a second resistance that is relatively high compared to the first resistance. The ability to change the resistance in a circuit by changing the polarity of one magnet in a pair of magnets provides the basis for MRAM cell technology. In short, a low-resistance magnetic circuit can represent a logic 0, and a high-resistance magnetic circuit can represent a logic 1.

The MRAM cell 100 can include a fixed-state magnet 108 and a free-state magnet 104 to control the resistance of the MRAM cell 100 and thus represent different logic states. The fixed-state magnet 108 may have a magnetic polarity that does not change during the operation of the MRAM cell 100. Thus, electrons in the fixed-state magnet 108 may spin in a single direction that does not change (e.g., clockwise when looking north to south). On the other hand, the electrons in the free-state magnet 104 may change to represent different logic levels.

Some embodiments of the MRAM cell 100 may use electrical currents to flip the spin direction of electrons in the free-state magnet 104. These currents may be provided through a bit line 102 and a word line 110. The free-state magnet 104 and the fixed-state magnet 108 may be separated by a tunnel barrier 106, and both magnets may be disposed between the bit line 102 and the word line 110. By causing current to flow from left-to-right in the bit line 102 and out of the page on the word line 110 as depicted in FIG. 1A, the spin of the electrons in the free-state magnet 104 can be caused to rotate in a clockwise direction. This polarization may represent a logic 1 value. Conversely, if current is caused to flow from right-to-left in the bit line 102 and into the page on the word line 110, the spin of the electrons in the free-state magnet 104 may be caused to rotate in a counter-clockwise direction. This polarization may represent a logic 0 value. When the current is turned off in the bit line 102 and/or the word line 110, the spin of the electrons in the free-state magnet 104 is maintained, which provides the "memory" function of the MRAM cell 100 until subsequent currents are applied to the bit line 102 and word line 110 to change the polarity of the free-state magnet 104.

Reading the logic value stored by the MRAM cell 100 may be performed by running the current through the fixed-state magnet 108, the tunnel barrier 106, and the free-state magnet 104. This read current can be applied by turning on a transistor formed by a drain 118 and a source 120 in a substrate 122 at the bottom of the MRAM cell 100. A gate 114 for the transistor can be formed by a read word line. To avoid confusion, some implementations may refer to the word line 110 as a "write word line" and to the gate 114 as a "read word line." When a voltage (e.g., 1.8 V) is applied to the gate 114, current flows from the drain 118 through the substrate 122 to the source 120 of the transistor. After exiting the source 120, the current may continue to flow through a conductor 116 into the fixed-state magnet 108, through the tunnel barrier 106, through the free-state magnet 104, and finally through the bit line 102. The current through and/or voltage drop across the magnets 104, 108 can be measured to determine the relative resistance when flowing through the free-state magnet 104 and the fixed-state magnet 108. When the current is measured at a first (e.g., relatively lower) current level, the state of the MRAM cell 100 can be interpreted as storing a logic 0 value. When the current is measured at a second (e.g., relatively higher) current level, the state of the MRAM cell 100 can be interpreted as storing a logic 1 value.

MRAM technology exhibits a number of inherent challenges that may prevent its use in certain applications. For example, some degree of separation or isolation may need to be maintained between individual MRAM cells such that magnet polarizations in one cell do not affect the magnet polarizations in neighboring cells. Additionally, large external magnetic sources may also interfere with internal MRAM cell states. However, one of the main challenges in emerging resistive memory technologies involves the sense amplifier circuitry that typically accompanies columns of memory cells.

When a voltage is applied to the gate 114 to read the state of the MRAM cell 100, the resulting current flows out of the bit line 102 into a sense amplifier. The sense amplifier then measures the difference between the resulting current and a reference current to determine whether the MRAM cell 100 is in a high-resistance state or in a low-resistance state. However, the difference in resistance between the logic 0 and logic 1 states of resistive memory cells may be very small, which leads to a very small resistance ratio between the on-state and off-state of the memory cell. Process variations in CMOS circuitry through which the electrical signals travel may be very close to the resistance window between states, and thus process variations can erode the very small margins for detecting the resistance difference between the logic 0 and logic 1 states. With such small resistance ratios, sensing circuits in the sense amplifier capable of distinguishing between logic states at high speeds represents a technical challenge that is solved by the embodiments described herein. Specifically, these embodiments present circuitry that can accompany a sense amplifier to sense very small current ratios with high immunity to both noise and process variations in the CMOS circuitry.

Figure 1B:
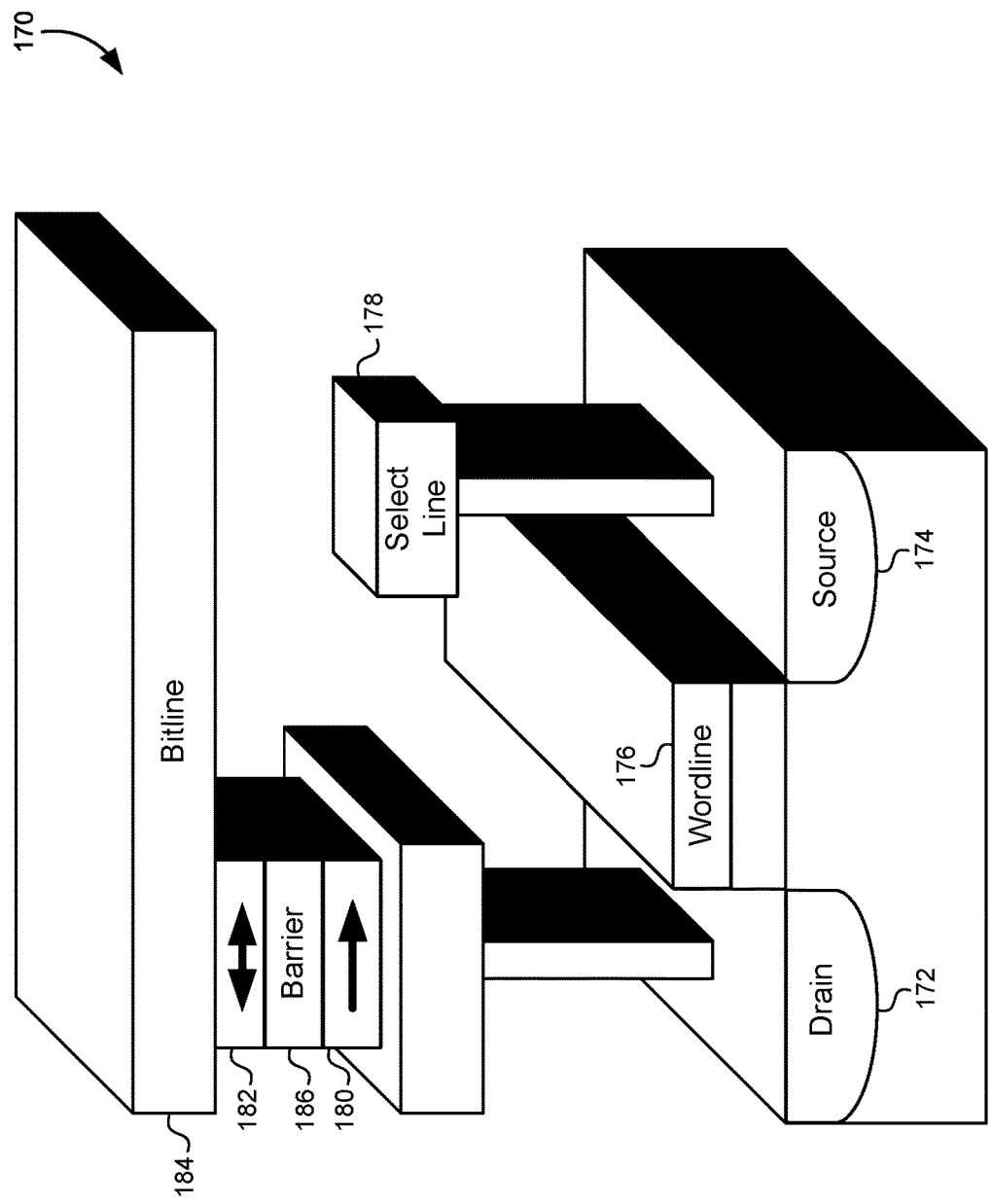
FIG. 1B illustrates a modern design for an MRAM cell, according to some embodiments.

FIG. 1B illustrates a modern design for an MRAM cell 170, according to some embodiments. This design uses a magnetic tunnel junction (MTJ) and a spin-polarized current to flip the spin of the electrons in one of the magnetic layers. A word line 176 runs over the gate of a transistor having a drain 172 and a source 174. The word line 176 can activate this transistor to access the contents of the MRAM cell 170. As described above, the MRAM cell 170 may include a fixed-state magnet 180 and a free-state magnet 182.

To change the memory state of the MRAM cell 170, a polarized current may be applied to flip the spin of the electrons in the free-state magnet 182. Electrons have a spin property describing a small quantity of angular momentum intrinsic to the electron. A polarized electrical current is one where the electrons have a predominant spin orientation in one direction or the other. This polarized current can cause the electrons in the free-state magnet 182 adopt a similar spin orientation. Consequently, this can cause the orientation of the free-state magnet to flip.

Like the MRAM cell 100 in FIG. 1A, the MRAM cell 170 in FIG. 1B includes a barrier oxide layer 186 between the fixed-state magnet 180 and the free-state magnet 182. Tunnel magnetoresistance is a magnetoresistive effect that occurs in an MTJ. The barrier oxide 186 may be thin enough that electrons can tunnel between the fixed-state magnet 180 and the free-state magnet 182. Thus, the spin-polarized current may be created and passed through the fixed-state magnet 108. The MTJ allows the angular momentum of the electron spin to be transferred through the MTJ into the free-state magnet 182 and thereby change its electron spins. This process changes the electrical resistance between low-resistance and high-resistance states.

Figure 1C:
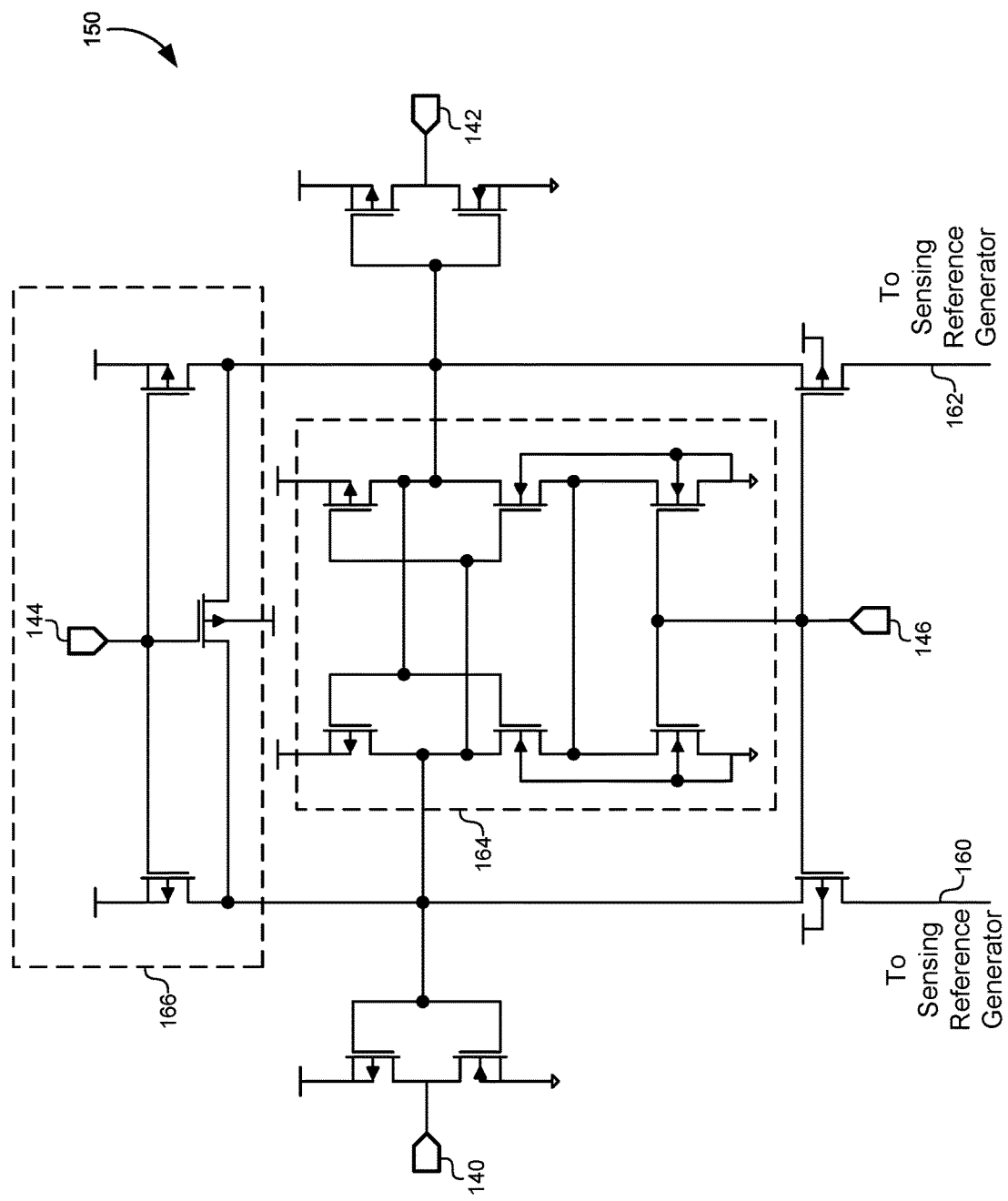
FIG. 1C illustrates a schematic of a sense amplifier, according to some embodiments.

FIG. 1C illustrates a schematic of a sense amplifier 150, according to some embodiments. This sense amplifier 150 includes both a reference current input 160 and a data current input 162. Some embodiments may include an enable input for the sense amplifier at connector 146. The enable input may power up the sense amplifier and/or disconnect the sense amplifier from the reference current input 160 and the data current input 162 to provide a fast sense-amplifier response. The sense amplifier 150 includes six transistors that act as a differential amplifier 164 that detects small differences between the reference current input 160 and the data current input 162. An input 144 can be used to control a sensing equalization circuit 166 comprised of three PMOS transistors that will tend to pull both sides of the sensing circuit to the same potential provided by a connected power supply. This allowed the sense amplifier 150 to act as a latch sense amplifier. Two outputs 140, 142 represent the inverted and non-inverted outputs of the sense amplifier 150 after passing through respective boost inverters.

Figure 2:
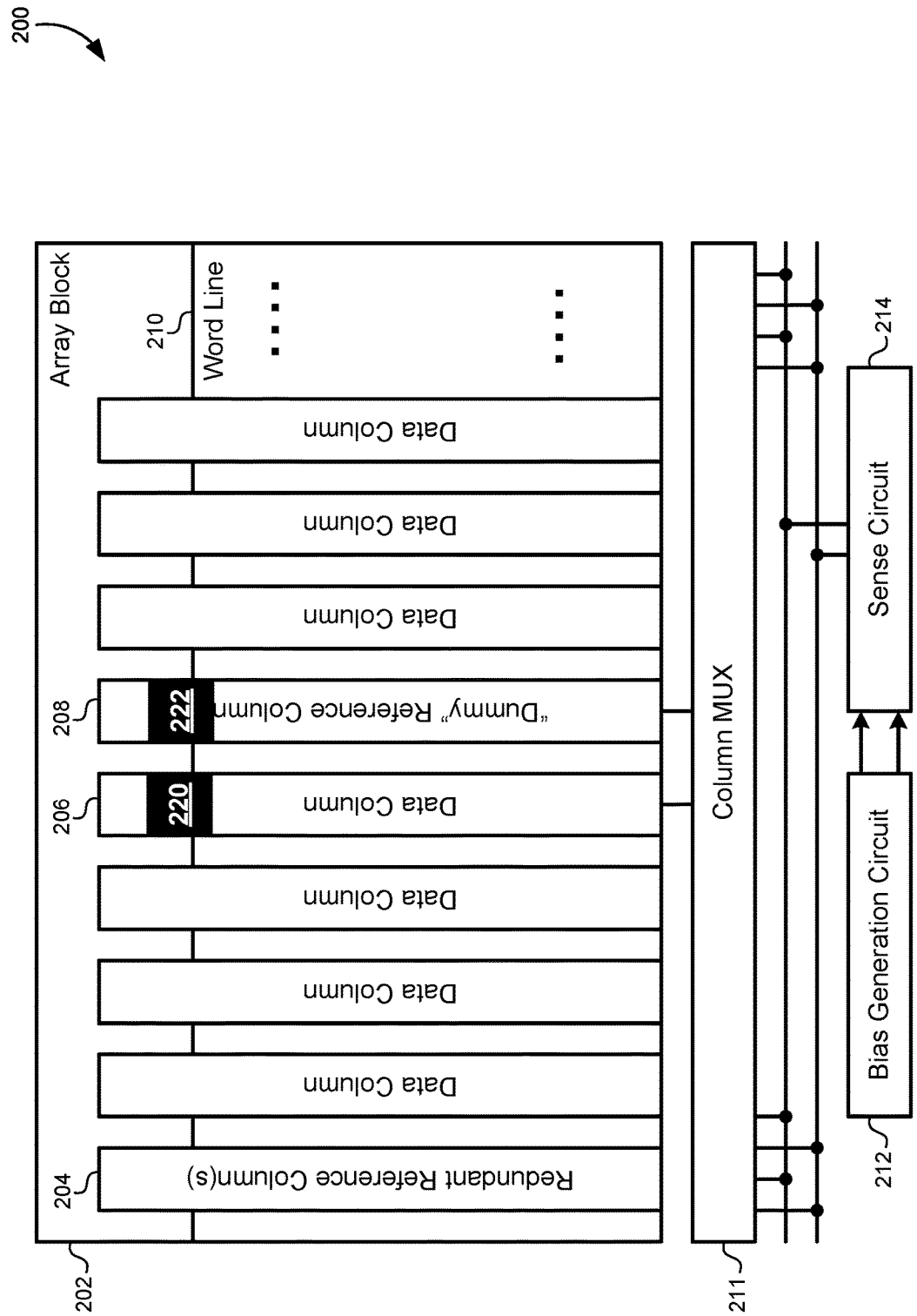
FIG. 2 illustrates a diagram of a memory architecture, according to some embodiments.

FIG. 2 illustrates a diagram of a memory architecture 200, according to some embodiments. The memory architecture 200 may include one or more memory arrays 202.

Each memory array 202 may include a plurality of data columns 206, and each of the plurality of data columns 206 may include a plurality of data bits. Data bits in the plurality of data columns 206 can be individually addressed by a word line 210 and a bit line (not shown). As in most traditional memory arrays, the output from the memory array 202 may pass through a column multiplexer 211 before passing into a sense amplifier.

This memory architecture 200 differs from traditional memory architectures in a number of different ways that improve the sensing ability of the sense amplifier. First, a current ratio between logic level 1 (e.g., a high-resistance state) and logic level 0 (e.g., a low-resistance state) may be boosted by filtering out common current components in the data current line and the reference current line. Second, a bias generation circuit 212 and a sense circuit 214 may provide the sense amplifier with immunity to process variations and memory-read disturbances. Third, the memory array block 202 may include one or more "dummy" reference columns that can be used to generate the reference current for the sense amplifier. This allows the reference current to track with process, voltage, and/or temperature (PVT) variations that will be very close to the variations that may be found in the plurality of data columns 206. Each of these features in the memory architecture 200 will be described in greater detail below.

The "dummy" or "reference" array columns may be placed in the memory array 202 to provide a reference current that is subject to the same process and timing variations as the regular data columns 206. For example, since the reference columns 208 may be manufactured on the same silicon substrate as the data columns 206 and using the same fabrication process, PVT variations caused by the manufacturing process may be substantially the same in both the data columns 206 and the reference columns 208. For example, if PVT variations cause the current from the data columns 206 to be slightly higher than a target value, the corresponding reference current coming from the reference columns 208 will similarly be slightly higher than the target value. If the temperature of the memory array block 202 increases/decreases, and thereby affects the internal resistances and/or currents of the data columns 206, the reference current from the reference columns 208 will be affected in the same way since its circuitry is subject to the same temperature variation. By placing the reference columns 208 in the memory array block 202, variations in the reference signal from the reference columns 208 can track any variations occurring in the data signal from the data columns 206.

In some embodiments, at least one reference column 208 may be used. The reference column 208 may be placed in an approximate center of the memory array block 202. As the size of the memory array block increases, additional reference columns 208 may be added to the memory array block 202. The column multiplexer 211 can select a reference current from one of the reference columns 208 that is physically closest to the data column 206 that is being read. This may be done to minimize difference in the trace lengths that are traversed by the reference signal and the data signal. Some embodiments may divide the memory array block 202 into different sectors, and each sector may have its own corresponding reference column 208 in the middle of the data columns 206 of that sector.

Some embodiments may include redundant reference columns 204. The redundant reference columns 204 may be used as backups in case the (primary) reference column 208 fails. Alternatively or additionally, the redundant reference columns 204 may provide additional data points for determining a reference current. For example, reference currents from a plurality of reference columns (e.g., reference columns 208 and redundant reference columns 204) may be averaged or otherwise combined together to generate a reference current for the read operation.

Each of the reference columns 208 may include a plurality of bit cells 222 that are similar to bit cells 220 that are found in the data columns 206. Some embodiments may allow the bit cells 222 in the reference columns 208 to be programmed with logic 0 or logic 1 values just like the bit cells 220 in the data columns 206. Some embodiments may program the bit cells 222 in the reference columns 208 to be set to the logic 0 state. Due to current levels and process characteristics, the logic 0 state may be more stable than the logic 1 state. Because of the polarity of the magnets in the MRAM cell, the logic 1 state is more easily disturbed during a read operation. Comparatively, the logic 0 state has a higher current and lower resistance, and is thus less susceptible to disturbances during the read operation.

In some environments, specific "dummy" reference columns 208 can be built into the array block 202 that do not function as regular data columns 206. Therefore, the reference columns 208 cannot be addressed or read using standard read/write operations at an external interface of the memory architecture 200. Instead, these reference columns 208 may only be read by internal operations to provide a reference current to the sense circuit 214. Alternatively or additionally, some embodiments may use reference columns 208 that can be externally addressed and/or read from or written to. This allows the values in the reference columns 208 to be dynamically set to values other than the default logic 0 signal level. Some embodiments may also use regular data columns 206 as reference columns. For example, a data signal may be read from a particular data column 208, and a reference signal may be read from a nearby data column that may be used as a reference column. These embodiments do not require that "dummy" reference columns be added to the array block 202 beyond the normal data columns.

Figure 3:
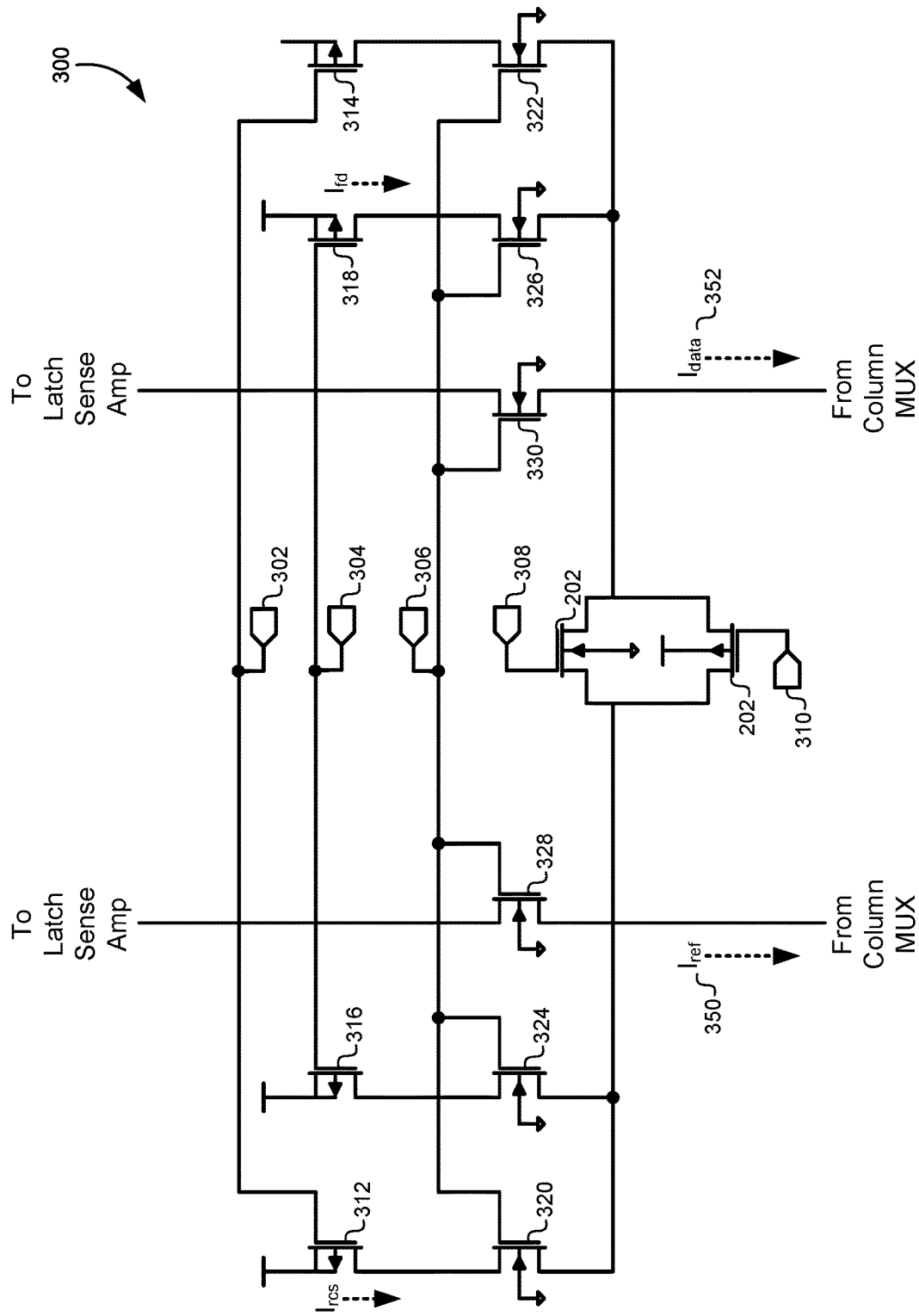
FIG. 3 illustrates a portion of the sense circuit that adjusts a reference current and a data current provided to the sense amplifier, according to some embodiments.

FIG. 3 illustrates a portion of the sense circuit 214 that adjusts a reference signal 350 and a data signal 352 provided to the sense amplifier 150, according to some embodiments. This portion of the sense circuit 214 may be referred to as a reference-generation circuit 300. The reference-generation circuit 300 may be based on three cascoding transistor circuit structures. The first cascoding set of transistors 328, 330 may act as a transistor pair to feed the final data signal 352 and reference signal 350 into the sense amplifier 150.

A second set of cascoding transistors 324, 326 may be used to filter or remove a common signal component from both the reference signal 350 and the data signal 352 coming from the data column and the reference column. The filtering signal may be generated from the regulated current sources provided by two PMOS transistors 316, 318. For example, the current generated through transistor 316 and modified by transistor 324 may generate a filtering current that is injected with the reference signal 350 sent into the sense amplifier 150. Similarly, the current generated through transistor 318 and modified by transistor 326 may generate a filtering current that is injected with the data signal 352 sent to the sense amplifier 150. These transistors can be matched such that the injection current is the same for both the data current 352 and the reference current 350. Transistors 328, 330 may be used for interfacing this filtering current injection into the data signal 352 and reference signal 350 lines to the sense amplifier 150. Because transistors 316, 318 provide a regulated current source, the same current can be injected (i.e., "subtracted") from both the reference signal 350 and the data signal 352.

These transistors 316, 324, 318, 326 and the associated biasing circuits described below may be collectively referred to as a "first circuit" that removes a common signal component from a reference signal and from a data signal. Although this example uses a reference current and a data current, other embodiments are not so limited. Some embodiments may instead measure voltage, resistance, power, inductance, and/or any other electrical characteristic that may be used to represent a logic level. Therefore, the signals may be referred to generically as a "reference signal" and a "data signal," and a "signal" may include currents and any other electrical characteristic that may be measured in a circuit.

A third set of cascoding transistors may include transistors 320, 322. These transistors 320, 322 may be used for adjusting the signal from the reference column by injecting a reference centering signal to generate the final reference signal 350. As described above, the reference column(s) may provide a reference signal output from a data bit at logic 0. To create a reference current 350 that can detect both logic 1 and logic 0 levels in the data signal 352, the reference signal 350 provided to the sense amplifier 150 may be adjusted. For example, transistor 320 and transistor 312 may be used to generate the reference-centering signal for the reference signal. The reference signal 350 may need to be large enough to detect logic 0 levels but also small enough to detect logic 1 levels. Ideally, the reference signal 350 may be set to be approximately halfway between the signal of a logic 0 cell and the signal of a logic 1 cell, thus placing the reference signal 350 in the center of these two possible data signal values.

In a manner similar to how the current was injected by transistors 324, 326, the centering signal can be injected and regulated using transistors 320, 322. The injected centering signal, such as a centering current, can be generated by transistors 312, 314 acting as a current source. In some embodiments, the data side of this cascoding circuit need not be supplied with power, and thus no current may need to be injected into the data signal 352 for this centering the reference signal. Only the reference signal 350 may need to be centered between the logic 0 and logic 1 current levels; the data current 352 may not need to be similarly centered. Instead, the transistors 314, 322 may be constructed as dummy transistors for maintaining loading balance in the overall circuit. By injecting a centering signal using transistors 320, 312, the reference signal 350 can be auto-trimmed for each array column. As described above, one of the key technical challenges addressed by these embodiments is to create a tight sensing window that tracks with variations between signals from data columns and reference signals used by the sense amplifiers. This auto-trimming performed by the centering current ensures that the window between logic 0 and logic 1 tracks with PVT variations in the data signal 352. These transistors 312, 320 (and optionally 314, 322) may be referred to as a "second circuit" that adjusts the reference signal to be between a logic 1 signal level and a logic 0 signal level.

For an MRAM memory cell, the tunnel magnetoresistance (TMR) may be described using the following equation.

$$TMR = \frac{R_{ap} - R_p}{R_p}$$

In this equation, $R_{ap}$ represents the logic 1 high resistance for the anti-parallel state of the memory cell, and $R_p$ represents the logic 0 lower resistance for the parallel state of the memory cell. For example, if the TMR is 1.5, then the resistance ratio $$\frac{R_{ap}}{R_p}$$

between the 1/0 states would be approximately 2.5. Considering process variations that affect these resistance values, along with the additional CMOS circuit variations on the bit line, word line, and column multiplexer, the worst-case resistance ratio may end up being much lower than 2.5. Additionally, the reference current 350 may also shift due to its own PVT variations, which adds to the challenges for MRAM sense amplifiers.

During a read operation, the sense amplifier may receive the current running through the MRAM bit cells as described above after it runs through the bit line, column multiplexer, and sensing circuits. The current detected by the sense amplifier using the reference signal 350 provided above can be characterized by the following equation.

$$\frac{I_p}{I_{ap}} = \frac{I_p - I_{ref}}{I_{ap} - I_{ref}}$$

In this equation, $I_p$ and $I_{ap}$ are currents corresponding to the $R_p$ and $R_{ap}$ resistances, and $I_{ref}$ is the current of the reference signal 350 described above. This equation shows that the closer $I_{ref}$ is to $I_{ap}$, the larger the current ratio.

The effect of the reference-generation circuit 300 illustrated in FIG. 3 is to center the reference current between the logic levels output by the data columns of the memory array such that the reference current 350 tracks the data current 352 as it drifts due to PVT variations. Although these embodiments are described using an MRAM array as an example, other resistive memory technologies may also benefit from using the reference-generation circuit 300 and other circuits described herein. For example, the memory array 202 depicted in FIG. 2 may comprise an MRAM array, a resistive RAM (ReRAM) array, a phase-change RAM (PCRAM) array, and/or any other resistive memory structure. Therefore, the reference-generation circuit 300, the reference columns 208, and the bias generation circuits described below may be used with any type of resistive memory and are not limited to the MRAM memory used herein merely by way of example.

Figure 4:
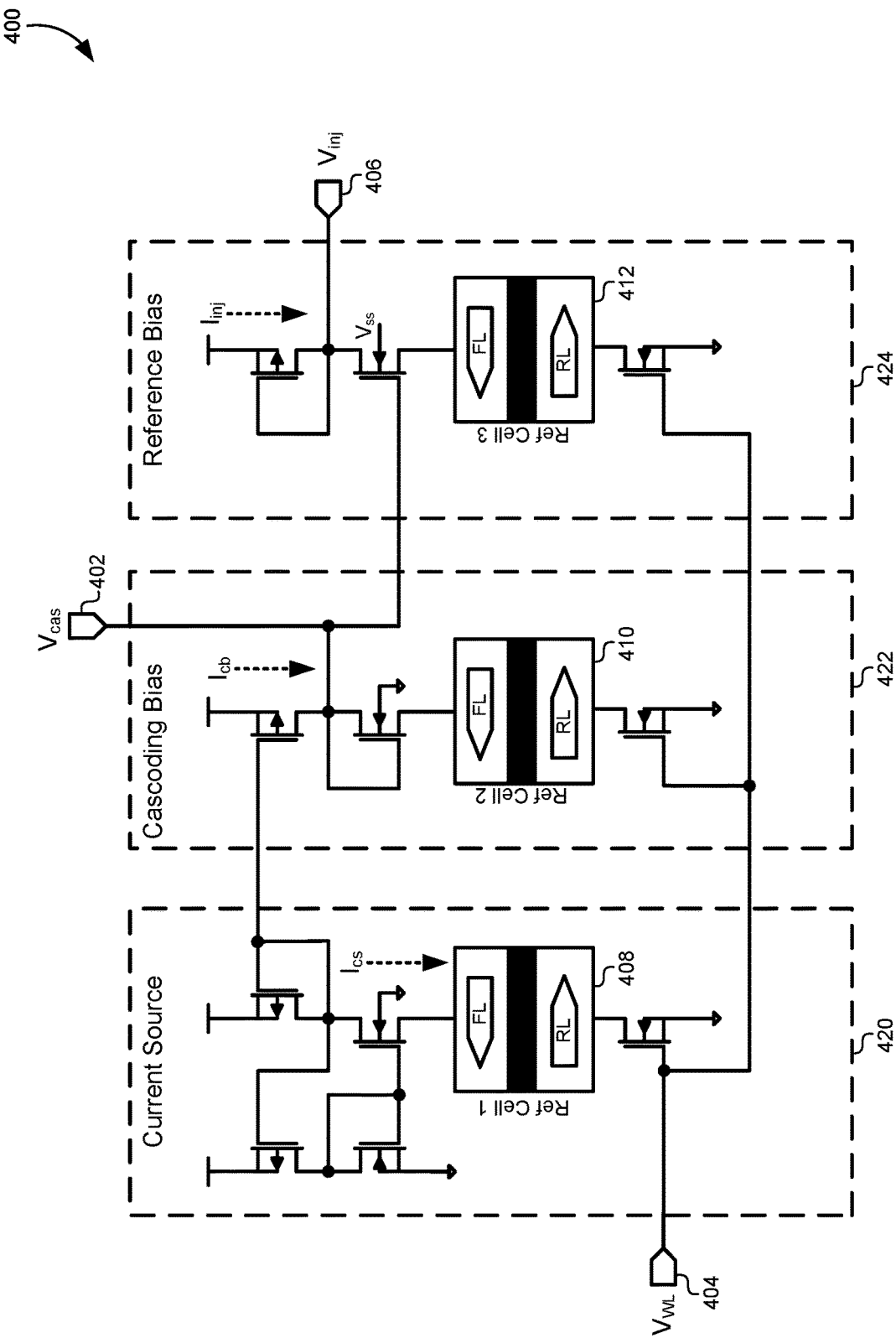
FIG. 4 illustrates a bias-generation circuit, according to some embodiments.

FIG. 4 illustrates a bias-generation circuit 400, according to some embodiments. The bias generation circuit 400 may include three separate sub circuits: a current source 420, a cascoding bias 422, and a reference bias 424. The current source 420 may generate a current based on the resistance of an MRAM bit cell 408. The current source 420 may be referenced by the cascoding bias circuit 422 and the reference by a circuit 424 to generate voltage levels for biasing cascoding circuits ($V_{cas}$ 402) and for regulating the injection currents of the filtering current ($V_{inj}$ 406). These reference levels may be generated based on dummy bit cells 408, 410, 412 in one or more reference columns as described above. This allows these reference voltages to automatically track PVT variations in the data bit cells and their associated pathways to the sense amplifier. The outputs from the bias-generation circuit 400 can be fed directly into the circuit of FIG. 3 to control the removal of the common signal component and the adjustment of the reference current. Specifically, the $V_{cas}$ output 402 may connect to the input 306 in FIG. 3, and the $V_{inj}$ output 406 may connect to the input 304 in FIG. 3.

Figure 5:
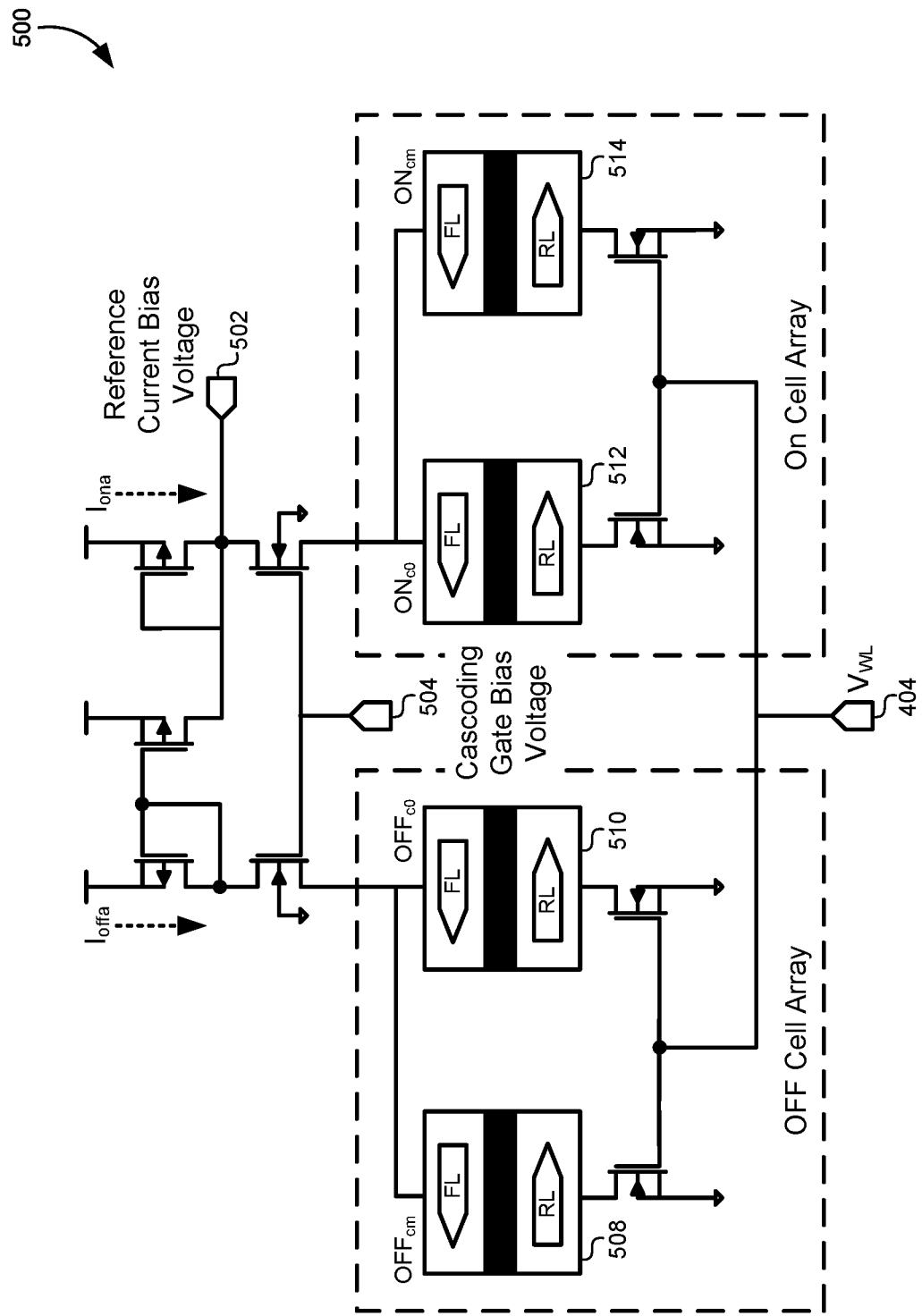
FIG. 5 illustrates circuits for generating additional reference biases used for the centering current, according to some embodiments.

FIG. 5 illustrates circuits 500 for generating additional reference biases used for the centering current, according to some embodiments. The $V_{WL}$ signal connects to the corresponding $V_{WL}$ input 404 in FIG. 4. The $V_{WL}$ signal may be used to turn on and off the reference-biasing circuits in FIG. 4 and FIG. 5 to save power. This enable signal can be generated from the word line signal in the memory circuit described above. These circuits use the difference between a logic 1 array current from bit cells 508, 510 and the logic 0 array current from bit cells 512, 514 to generate the referent current bias 502. The terminals in the circuits 500 of FIG. 5 may be connected to corresponding terminals in the previous figures. For example, output 502 for the reference current bias voltage may be connected to terminal 302 in FIG. 3. Terminal 504 for the cascoding gate bias voltage may be connected to the corresponding output 404 in FIG. 4.

Figure 6:
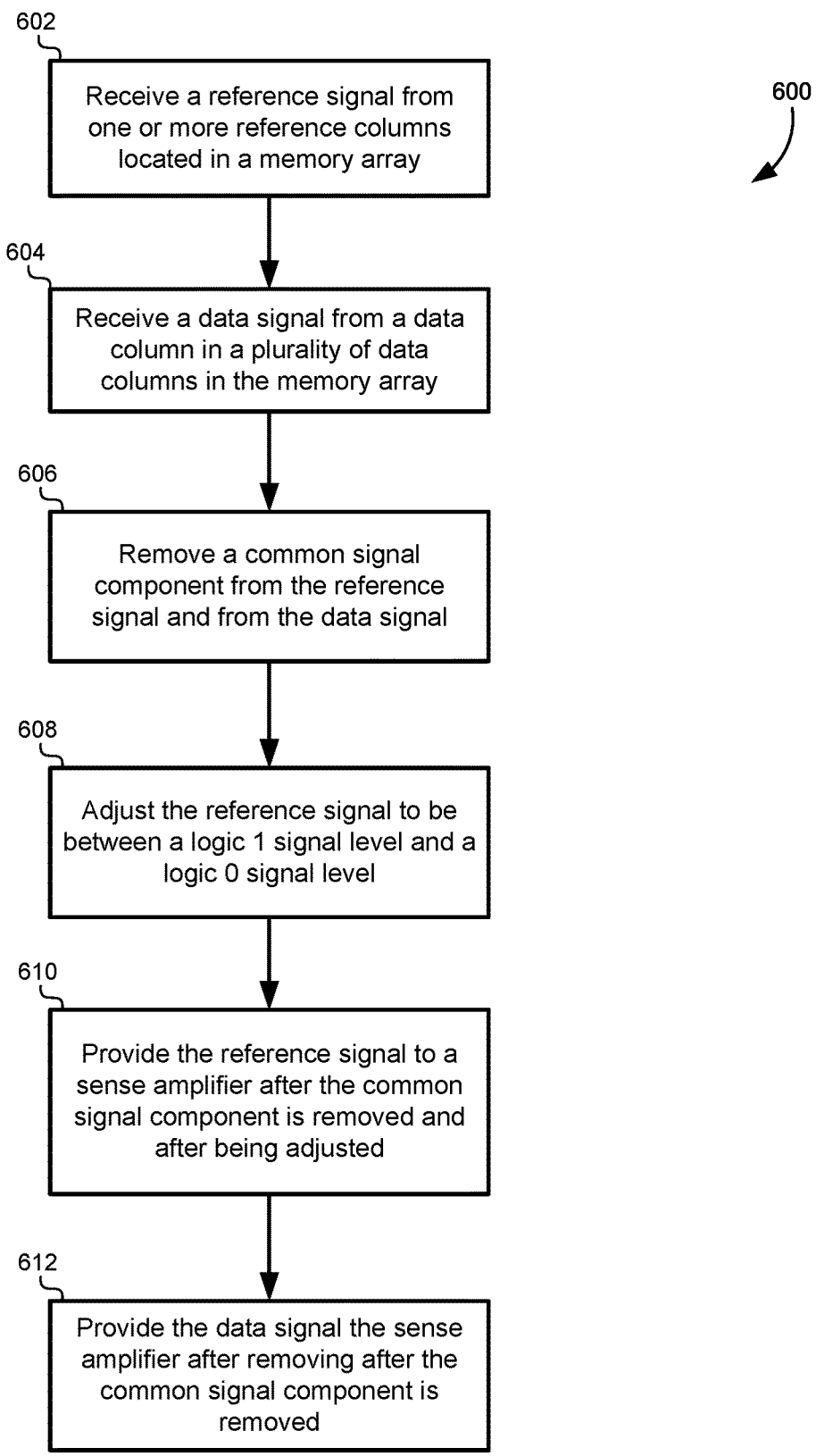
FIG. 6 illustrates a flowchart of a method for reading data from a memory circuit, according to some embodiments.

FIG. 6 illustrates a flowchart of a method for reading data from a memory circuit, according to some embodiments. The method may include receiving a reference signal from one or more reference columns located in a memory array (602). The memory array may include MRAM cells or any other type of resistive memory cells. The one or more reference columns may be located throughout the memory array, including at an approximate center of the memory array or interspersed within the memory array at regular intervals. A subset of the one or more reference columns may be selected for the read operation based on proximity to a corresponding data column. For example, each data column may be assigned to a specific reference column that is in the same sector of the memory array. Some embodiments may also select regular data columns that can be used as reference columns when those data columns are not being actively read.

In some embodiments, a plurality of the one or more reference columns may be used to generate the reference signal. For example, output currents from the plurality of reference columns may be averaged or otherwise combined together to generate the final reference signal. The memory array may also include redundant reference columns that can be used as a backup to primary reference columns in case the primary reference columns fail. The redundant reference column outputs may also be averaged with the primary reference column output to generate the reference signal. The value stored in the one or more reference columns may either be programmable or hard-coded into the reference column. Some embodiments may use a logic level 0 in each of the bit cells in the reference column.

The method may also include receiving a data signal from a data column in a plurality of data columns in the memory array (604). Each of the data columns may include a number of bit cells, each of which stores a representation of a logic 0 or a logic 1. For example, each bit cell may set a polarity of a free-state magnet to store a representation of a logic value. The particular data column may be selected by a read operation using a bit line of the memory array. When selected for the read operation, the data column may provide a data signal. In some embodiments, both the data signal and the reference signal may include an electrical current and/or an electrical voltage value. For example, a current may be provided from the data column to a sense amplifier for comparison to a reference current. Note that although step 602 and step 604 are shown sequentially in flowchart 600, these steps will usually be executed in parallel. Specifically, the reference signal and the data signal may be sent from the memory array and received by the sense amplifier at the same time, thereby eliminating any timing differences associated with the different signals.

The method may additionally include removing a common signal component from the reference signal and from the data signal (606). The common signal component may be a common current component which may be removed from a reference current and from a data current. The common signal component may be removed using a first circuit comprising a pair cascoding transistors for the reference current and a pair of cascoding transistors for the data current. The pairs of cascoding transistors can be matched such that they remove the same common signal from both the reference signal and the data signal. Each pair of cascoding transistors may include series-connected NMOS and PMOS transistors. An example of a first circuit for removing the common signal component is illustrated above in FIG. 3.

The method may further include adjusting the reference signal to be between a logic 1 signal level and a logic 0 signal level (608). For example, the reference signal may be reduced from a high signal level received from a logic 0 output from the reference column. The reference signal may be reduced to an approximate midpoint or centered between the logic 1 signal level and the logic 0 signal level. As with the first circuit for removing the common signal component, a second circuit may include a cascoding pair of series-connected NMOS and PMOS transistors for the reference signal. Corresponding transistors may also be included for the data signal, however, these transistors need not be powered, but may instead be included such that the circuits for the data signal and the reference signal both match. An example of a second circuit for adjusting the reference signal is illustrated above in FIG. 3. Note that although step 606 and step 608 are shown sequentially in flowchart 600, these steps may also be executed in parallel. Specifically, the common signal component can be removed and the reference signal can be adjusted in parallel using the cascoding transistor branches at the same time as illustrated in FIG. 3.

The method may also include providing the reference signal to a sense amplifier (610). The reference signal may be provided to the sense amplifier after the common signal component is removed and after being adjusted to be between the logic 1 signal level and the logic 0 signal level. For example, when the reference signal includes a reference current, the reference current can be reduced by injecting an opposing current into the reference current to reduce the reference signal level. When the reference column outputs a logic 0 signal level, the reduced from the high logic 0 level to be between the logic 0 level and the logic 1 level.

The method may additionally include providing the data signal to the sense amplifier (612). The data signal may be provided to the sense amplifier after removing the common signal component as described above. The sense amplifier may be configured to detect differences between logic 1 and logic 0 signals received from a memory array through the data signal. These differences may be detected by comparing the reference signal to the data signal. The sense amplifier may include any configuration of sense amplifier, including the latching sense amplifier illustrated in FIG. 1C. Note that although step 610 and step 612 are shown sequentially in flowchart 600, these steps will usually be executed in parallel. Specifically, the reference signal and the data signal may be received by the sense amplifier at the same time. Because both signals are activated by the same write line, they will typically propagate through the circuit of FIG. 3 and arrive at the sense amplifier at the same time.

It should be appreciated that the specific steps illustrated in FIG. 6 provide particular methods of reading data from a memory circuit according to various embodiments. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the exemple embodiments will provide those skilled in the art with an enabling description for implementing an exemple embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A memory circuit comprising:
a memory array comprising:
a plurality of data columns, wherein the plurality of data columns are configured to store data bits and provide data signals when selected by a read operation; and
one or more reference columns distributed in the memory array and configured to provide a reference signal; and
a first circuit that removes a common signal component from the reference signal and from the data signals.

2. The memory circuit of claim 1, wherein the memory array comprises a Magnetic RAM (MRAM) array.

3. The memory circuit of claim 1, wherein the one or more reference columns comprises a reference column located in an approximate center of the memory array.

4. The memory circuit of claim 1, wherein the one or more reference columns comprises a plurality of reference columns, and wherein the reference signal is generated by averaging currents from a subset of the plurality of reference columns.

5. The memory circuit of claim 1, wherein the one or more reference columns comprises a first reference column that provides the reference signal, and a second reference column that acts as a backup for the first reference column.

6. The memory circuit of claim 1, wherein the plurality of data columns in the memory array comprise pluralities of bit cells configured to output stored logic levels, and the one or more reference columns comprise a plurality of bit cells that are configured to output a logic 0 signal level.

7. The memory circuit of claim 1, further comprising:
one or more circuits that receive a data signal from the plurality of data columns and the reference signal in response to the read operation, and use the reference signal to determine whether the data signal represents a logic 1 or a logic 0.

8. The memory circuit of claim 7, wherein the one or more circuits comprise:
a second circuit that adjusts the reference signal to be between a logic 1 signal level and a logic 0 signal level.

9. The memory circuit of claim 7, wherein the one or more circuits comprise:
a sense amplifier that determines whether the data signal represents the logic 1 or the logic 0 using:
the reference signal after a common signal component is removed and after being adjusted to be between a logic 1 signal level and a logic 0 signal level; and
the data signal after having the common signal component removed.

10. A method of reading data from a memory circuit, the method comprising:
receiving, by a memory array, a read signal;
generating, by the memory array, a data signal from a data column in a plurality of data columns in the memory array, wherein the data signal is provided by the data column when selected by a read operation;
generating, by the memory array, a reference signal from one or more reference columns distributed in the memory array; and
removing a common signal component from the reference signal and from the data signal.

11. The method of claim 10, wherein the memory array comprises a Magnetic RAM (MRAM) array.

12. The method of claim 10, wherein the one or more reference columns comprises a reference column located in an approximate center of the memory array.

13. The method of claim 10, wherein the one or more reference columns comprises a plurality of reference columns, and wherein the reference signal is generated by averaging currents from a subset of the plurality of reference columns.

14. The method of claim 10, wherein the one or more reference columns comprises a first reference column that provides the reference signal, and a second reference column that acts as a backup for the first reference column.

15. The method of claim 10, wherein the plurality of data columns in the memory array comprise pluralities of bit cells configured to output stored logic levels, and the one or more reference columns comprise a plurality of bit cells that are configured to output a logic 0.

16. The method of claim 10, further comprising:
adjusting the reference signal by reducing the reference signal to an approximate center signal level between a logic 1 signal level and a logic 0 signal level.

17. The method of claim 16, further comprising:
reducing the reference signal by injecting a signal into the reference signal, wherein an amount of the signal injected into the reference signal is controlled by a cascoding transistor pair.

18. The method of claim 10, wherein removing the common signal component from the reference signal and from the data signal comprises injecting a signal into the reference signal and the data signal, wherein an amount of the signal injected into the reference signal and the data signal is controlled by cascoding transistor pairs.

19. The method of claim 10, wherein the reference signal tracks with process, voltage, and temperature variations that are specific to the memory array.

* * * * *